United States Patent
Tao et al.

(10) Patent No.: US 7,898,875 B2
(45) Date of Patent: Mar. 1, 2011

(54) WRITE ASSIST CIRCUIT FOR IMPROVING WRITE MARGINS OF SRAM CELLS

(75) Inventors: Derek C. Tao, Fremont, CA (US);
Annie-Li-Keow Lum, San Jose, CA (US); Chung-Ji Lu, Taichung (TW);
Subramani Kengeri, San Jose, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 134 days.

(21) Appl. No.: 12/253,735

(22) Filed: Oct. 17, 2008

(65) Prior Publication Data

US 2009/0285010 A1 Nov. 19, 2009

Related U.S. Application Data

(60) Provisional application No. 61/127,585, filed on May 14, 2008.

(51) Int. Cl.
*G11C 7/10* (2006.01)

(52) U.S. Cl. .......... 365/189.05; 365/189.16; 365/185.23; 365/189.02

(58) Field of Classification Search ............. 365/189.05, 365/189.16, 185.23, 185.05, 189.02
See application file for complete search history.

(56) References Cited

U.S. PATENT DOCUMENTS

| | | | | |
|---|---|---|---|---|
| 5,831,924 | A * | 11/1998 | Nitta et al. | 365/189.17 |
| 6,462,584 | B1 * | 10/2002 | Proebsting | 327/52 |
| 6,614,691 | B2 * | 9/2003 | Roohparvar | 365/185.23 |
| 6,657,913 | B2 * | 12/2003 | Abedifard et al. | 365/230.03 |
| 7,599,208 | B2 * | 10/2009 | Kang | 365/145 |
| 2002/0064075 | A1 * | 5/2002 | Morishima | 365/203 |
| 2003/0107923 | A1 * | 6/2003 | Roohparvar | 365/189.02 |
| 2006/0262628 | A1 | 11/2006 | Nii et al. | |
| 2008/0266928 | A1 * | 10/2008 | Shinozaki et al. | 365/72 |

FOREIGN PATENT DOCUMENTS

CN 1870175 A 11/2006

* cited by examiner

*Primary Examiner* — Tuan T. Nguyen
(74) *Attorney, Agent, or Firm* — Slater & Matsil, L.L.P.

(57) ABSTRACT

A memory circuit includes a memory array, which further includes a plurality of memory cells arranged in rows and columns; a plurality of first bit-lines, each connected to a column of the memory array; and a plurality of write-assist latches, each connected to one of the plurality of first bit-lines. Each of the plurality of write-assist latches is configured to increase a voltage on a connecting one of the plurality of first bit-lines.

37 Claims, 6 Drawing Sheets

WRITE ASSIST CIRCUIT FOR IMPROVING WRITE MARGINS OF SRAM CELLS

This application claims priority to U.S. Provisional Patent Application Ser. No. 61/127,585, filed May 14, 2008, and entitled "Write Assist Circuit for Improving Write Margins of SRAM Cells," which application is hereby incorporated herein by reference.

TECHNICAL FIELD

This invention relates generally to semiconductor devices, and more particularly to memory arrays, and even more particularly to the design and operations of static random access memory (SRAM) arrays.

BACKGROUND

Static random access memory (SRAM) is commonly used in integrated circuits. SRAM cells have the advantageous feature of holding data without a need for refreshing. SRAM cells may include different numbers of transistors, and are often accordingly referred to by the number of transistors, for example, six-transistor (6T) SRAM, eight-transistor (8T) SRAM, and the like. The transistors typically form a data latch for storing a bit. Additional transistors may be added to control the access to the transistors. SRAM cells are typically arranged as an array having rows and columns. Typically, each row of the SRAM cells is connected to a word-line, which determines whether the current SRAM cell is selected or not. Each column of the SRAM cells is connected to a bit-line (or a pair of bit-lines), which is used for storing a bit into, or read from, the SRAM cell.

With the increasing down-scaling of integrated circuits, the operation voltages of integrated circuits are reduced, along with the operation voltages of memory circuits. Accordingly, read and write margins of the SRAM cells, which measure how reliably the bits of the SRAM cells can be read from and written into, are reduced. Due to the existence of static noise, the reduced read and write margins may cause errors in the respective read and write operations.

FIG. 1 illustrates a portion of a conventional SRAM array, which includes a plurality of SRAM cells: C(1) through C(n) in a same column. SRAM cell C(1) is close to a pair of write drivers, which charge differential bit-lines BL and BL_. SRAM cell C(n) is close to the terminating end of the differential bit-lines BL and BL_, at which the differential bit-lines BL and BL_ terminate. Bit-lines BL and BL_ may be quite long, depending on the number of rows in the SRAM array. In very small-scale integrated circuits, the differential bit-lines BL and BL_ are very thin and narrow, and hence their resistances are no longer negligible. Since the voltages on bit-lines BL and BL_ are provided by the write drivers, the differential bit-line voltages at the terminating end of the differential bit-lines BL and BL_ will be noticeably lower than the voltages provided by the write drivers.

The reduced voltages on differential bit-lines BL and BL_result in the already low write margin to be further reduced. This may reduce the speed of write operations, and may even cause the failure of the write operations when the write margin reduces to 0 mV. This prevents the further desirable reduction of Vccmin, which is the higher one of the minimum voltages required to read data from, and write data into, SRAM memory cells. Therefore, new SRAM arrays having improved write margins are needed.

SUMMARY OF THE INVENTION

In accordance with one aspect of the present invention, a memory circuit includes a memory array, which further includes a plurality of memory cells arranged in rows and columns; a plurality of first bit-lines, each connected to a column of the memory array; and a plurality of write-assist latches, each connected to one of the plurality of first bit-lines. Each of the plurality of write-assist latches is configured to increase a voltage on a connecting one of the plurality of first bit-lines.

In accordance with another aspect of the present invention, a memory circuit includes a control block comprising a plurality of Y-decode outputs; a write enable line; and a memory array. The memory array includes a plurality of memory cells arranged in rows and columns, wherein the columns include a first column and a second column; a first bit-line connected to the first column; a multiplexer connected to a starting end of the first bit-line, wherein the multiplexer is further connected to a first Y-decode output in the plurality of Y-decode outputs through a first Y-decode signal line; a write driver connected to the multiplexer; a first write-assist latch connected substantially close to a terminating end of the first bit-line; and a first assist-enable unit including a first input connected to the first Y-decode signal line, a second input connected to the write enable line, and an output connected to the first write-assist latch. The first write assist latch is configured to be enabled and disabled by the output of the first assist-enable unit.

In accordance with yet another aspect of the present invention, a memory circuit includes a control block including a plurality of local control signal lines; and a memory array. The memory array includes a plurality of memory cells arranged in rows and columns; and a row of write-assist latches, each connected to one column of the memory cells. The row of write-assist latches is connected to one of the plurality of local control signal lines.

In accordance with yet another aspect of the present invention, a method of operating a memory circuit includes providing a control block including a plurality of Y-decode signal lines; and providing a memory array including a column; a bit-line connected to the column; a multiplexer connected to a starting end of the bit-line; and a first write-assist latch connected to the bit-line. The method further includes, during a writing time of a memory cell in the column, turning on the write-assist latch to increase a voltage on the bit-line.

In accordance with yet another aspect of the present invention, a method of operating a memory circuit includes providing a control block including a plurality of Y-decode signal lines; and providing a memory array including a first column; a first differential pair of bit-lines connected to the first column; a multiplexer connected to a starting end of the first differential pair of bit-lines; and a first write-assist latch connected substantially close to a terminating end of the first differential pair of bit-lines. The method further includes, during a writing time for a memory cell in the first column, turning on the first write-assist latch to increase a voltage on one of the differential pairs of bit-lines.

In accordance with yet another aspect of the present invention, a method of operating a memory circuit includes providing a control block including a plurality of local control signal lines; and providing a memory array including a first segment; a first row of write-assist latches in the first segment; a plurality of differential pairs of bit-lines, each pair being in a column of the array, wherein each pair is connected to one write-assist latch in the first row; a second segment; and a second row of write-assist latches in the second segment and connected to the plurality of differential pairs of bit-lines. Each pair of the plurality of differential pairs of bit-lines is connected to one write-assist latch in the second segment. The method further includes, during a writing time for a memory cell in the first segment, turning on the first row of write-assist latches.

The advantageous features of the present invention include increased Vccmin of SRAM cells, and improved writing speed.

BRIEF DESCRIPTION OF THE DRAWINGS

For a more complete understanding of the present invention, and the advantages thereof, reference is now made to the following descriptions taken in conjunction with the accompanying drawings, in which:

FIG. 6 illustrates an exemplary implementation of a write-assist latch shown in

FIG. 5.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel static random access memory (SRAM) array with improved immunity to the voltage drop on bit-lines is provided. The variations and operations of the preferred embodiments are then discussed. Throughout the various views and illustrative embodiments of the present invention, like reference numbers are used to designate like elements.

Figure 1:
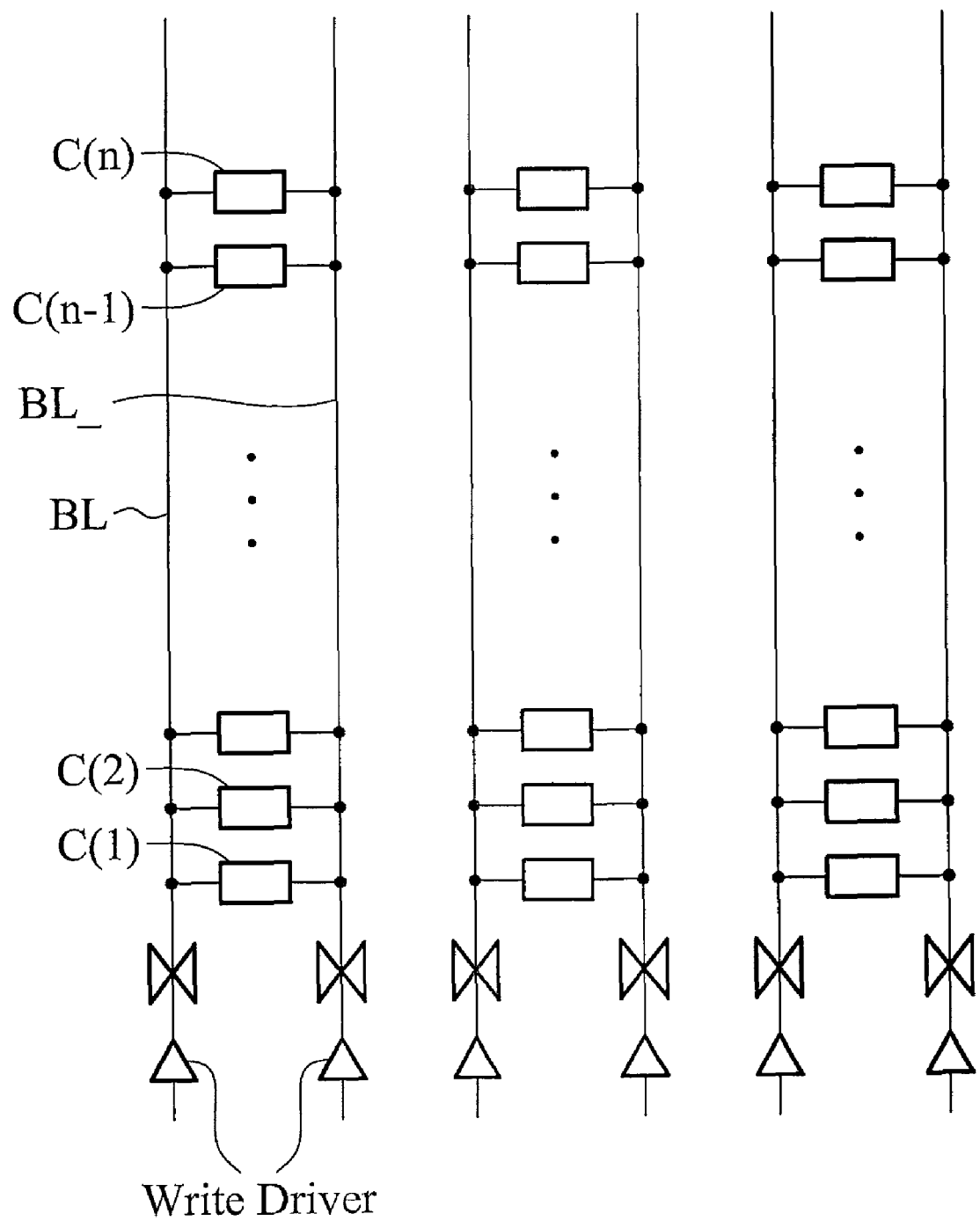
FIG. 1 illustrates a portion of a conventional memory array.
Figure 2:
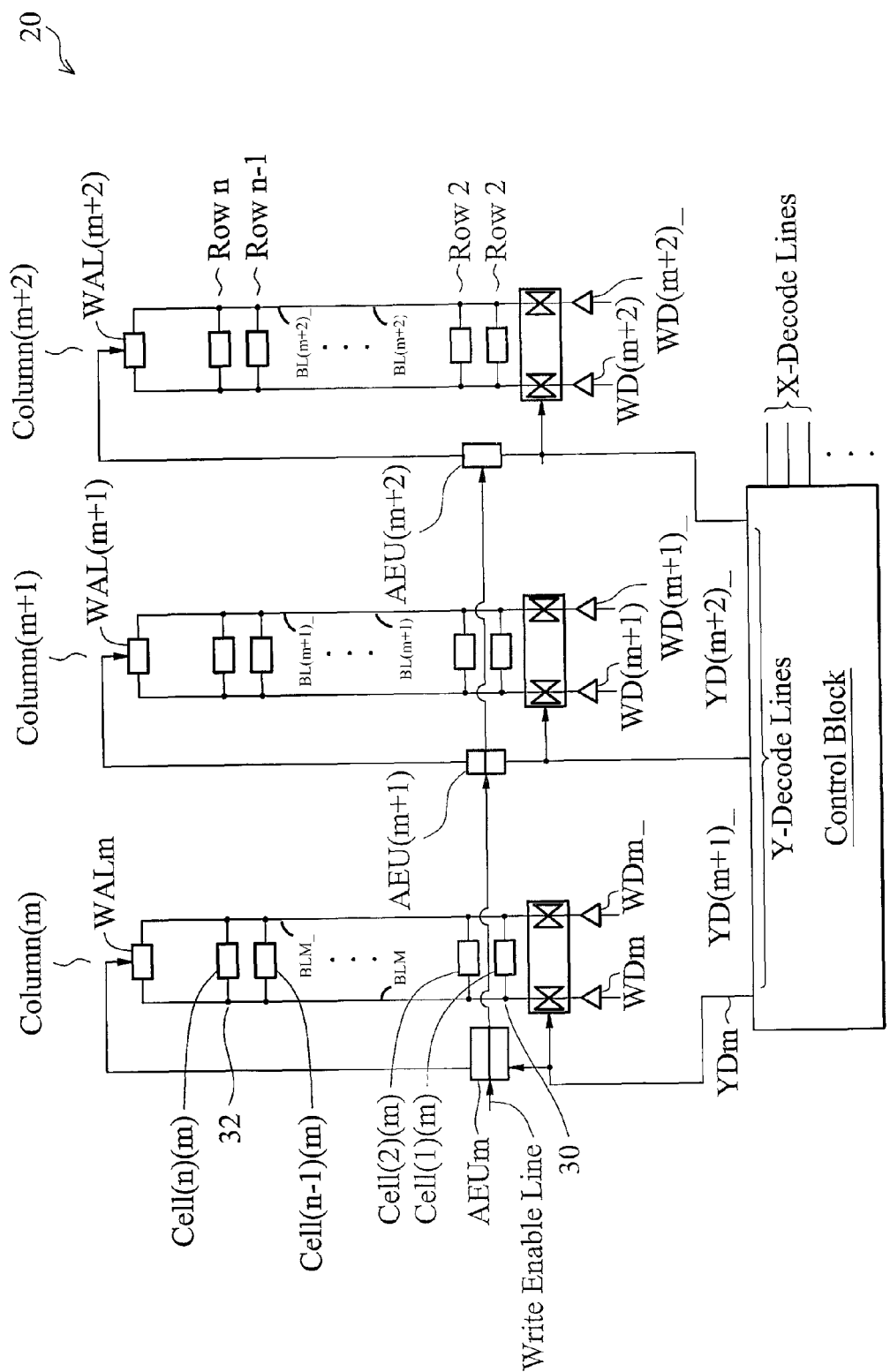
FIG. 2 illustrates an embodiment of the present invention, wherein a write-assist latch is connected to a terminating end of a differential pair of bit-lines, and the operation of the write-assist latch is controlled by an assist-enable unit.

FIG. 2 illustrates an embodiment of the present invention, wherein a portion of SRAM array 20 is shown. SRAM array 20 includes a plurality of rows and a plurality of columns. FIG. 2 only illustrates columns m, m+1, and m+2, where "m" is an integer greater than 0. There may be more columns on the left and/or right sides of the illustrated columns. The rows of SRAM array are denoted as row 1 through row n, wherein the number "n" is an integer greater than 1. The SRAM cells in SRAM array 20 may be referred to using the respective row number and column number. For example, the SRAM cell at row n and column m is referred to as cell(n)(m). Each column of SRAM array 20 is connected to a pair of differential bit-lines, which are referred to as BL and BL_. Each pair of the differential bit-lines may also be referred to using the respective column number. For example, the differential bit-lines in column m are referred to as BLm and BLm_. The differential bit-lines are preferably for write operations of the memory cells, and hence are also referred to as write bit-lines (as compared to read bit-lines for read operations). In alternative embodiments, there may be only one write bit-line for each column. However, the teaching provided by the present invention still applies.

Each column of SRAM cells is also connected to one (or a pair of) multiplexer (referred to as Y-Mux hereinafter) and one (or a pair of) write driver WD (and WD_), each may be referred to using the respective column number. The write drivers WD set the data (the voltages) on the pair of differential bit-lines, which data are then written into the intended memory cell in the same column. The Y-Muxs are connected to, and controlled by, a control block, which provides decode signals (referred to as Y-decode signals hereinafter) for turning on or off each of the Y-Muxs individually, or in a group, so that the voltages provided by the write drivers are transferred to the differential bit-lines. The control block may further include x-decoder lines connected to the rows of the SRAM array 20.

In the illustrated embodiment, write drivers WD are close to the starting ends of the differential bit-lines BL and BL_, which starting ends are on the side of row 1. Accordingly, differential bit-lines BL and BL_ terminate at the end close to row n. At the terminating end of each of the columns, a write-assist latch (WAL) is connected to the respective differential bit-lines BL and BL_. Again, the write-assist latches WAL may be referred to using the respective column number.

Figure 3:
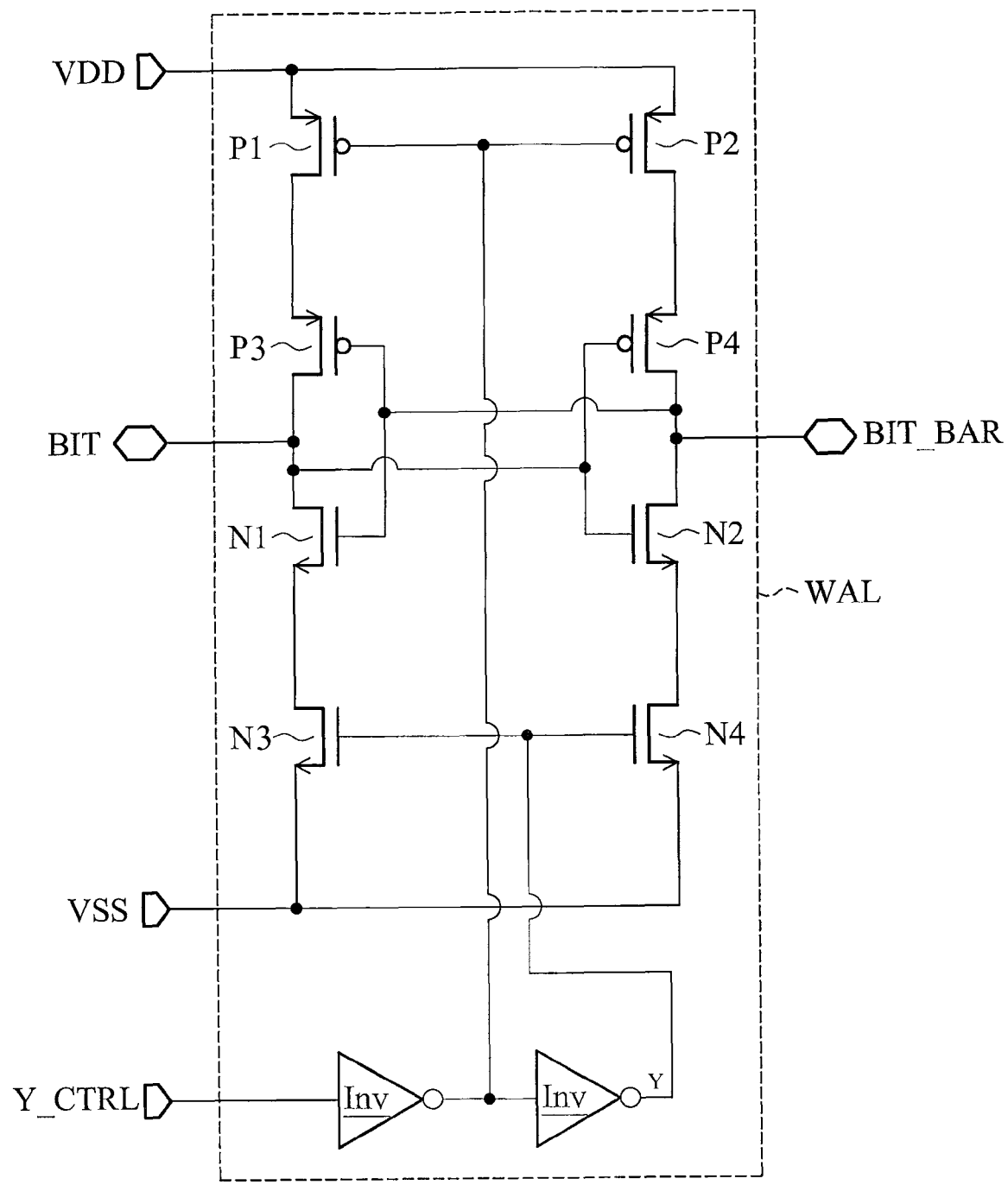
FIG. 3 illustrates an exemplary implementation of a write-assist latch shown in FIG. 2.

It is realized that with the increasing down scaling of the integrated circuits, bit-lines BL and BL_ become increasingly thinner and narrower, and the resistance becomes increasingly greater, the voltage drop between the starting ends and the terminating ends of the differential bit-lines BL and BL_ may be greater, enough to at least affect the write speed. If the write margin is further reduced, erroneous writing may occur. For example, if the voltage at point 30 is 1V, at point 32, the voltage may drop to 0.9 V or even 0.8 V. The write-assist latches WAL have the function of picking up the voltages on the connecting differential bit-lines BL and BL_, and amplifying the amplitude of the voltages to the operation voltages (for example, VDD as shown in FIG. 3). In other words, the write-assist latches WAL may restore the bit-line voltages at the terminating ends of the bit-lines to the same amplitudes as at the starting ends, or even higher, if desirable.

Write-assist latches WAL are connected to, and controlled by, assist-enable units (AEU), which turn on and off the respective write-assist latches WAL. In the preferred embodiment, an assist-enable unit AEU only turns on the respective write-assist latch WAL during the write operations of SRAM cell(s) in the same column. When no SRAM cell in the same column is being written into (regardless whether they are read from, or at a stand-by mode), the assist-enable unit AEU turns off the connecting write-assist latch WAL. Each of the assist-enable units AEU may control its connecting write-assist latch independent from the states of assist-enable units AEU in other columns. Therefore, when write-assist latch WALm is turned on, write-assist latch WAL(m+1) may be turned off.

In the preferred embodiment, each of the assist-enable units AEU is connected to, and controlled by, the same Y-decode lines YD, wherein each Y-decode line YD may be referred to using the respective column number. This means an assist-enable unit AEU outputs an assist-enable signal (for turning on the write-assist latch WAL) to the connecting write-assist latch WAL only when the respective column is selected. Otherwise, the assist-enable unit AEU outputs an assist-disable signal for turning off the write-assist latch WAL. Further, each of the assist-enable units AEU is connected to, and controlled by, a write enable line carrying the "write-enable" signal. The assist-enable unit AEU thus outputs the assist-enable signal when both the respective column is selected (the Y-decode signal of the respective column is on), and the write enable signal is on. To ensure a write-assist latch WAL is turned on only after the respective differential bit-lines have adequate threshold differential voltages, as discussed in detail in subsequent paragraphs, the respective connecting assist-enable unit AEU is preferably synced with the voltages on the differential bit-lines BL and BL_. Accordingly, the assist-enable unit AEU delays a period of time after both the write-enable signal and the Y-decode signal are provided. The assist-enable unit AEU then sends the assist-enable signal to the corresponding write-assist latch WAL. The length of the delay is partially affected by the driving ability of the write drivers WD, and the more powerful the write drivers are, the shorter the delay is needed.

By controlling write-assist latches WAL using the Y-decode signals, only the write-assist latches WAL whose column has SRAM cells to be written into, are turned on, and hence power consumption is reduced. In addition, since the write-assist latches WAL can only be turned on when the respective differential bit-lines BL and BL_ have adequate threshold voltages, in the columns having no SRAM cells to be written into, the respective write-assist latches WAL (which remain turned off) don't have to wait until the differential bit-lines BL and BL_ reach the threshold voltages, which is a slow process due to the weak driving power of SRAM cells. Therefore, forbidding turning on the write-assist latches WAL in the columns with no SRAM cells to be written into significantly improves the write speed.

Although FIG. 2 illustrates the write-assist latches WAL connected to the very end of the terminating ends, they can also be connected to locations substantially close to, but not exactly at, the terminating ends. In addition, if needed, more write-assist latches WAL may be added at different positions, for example, in the middle of the differential bit-lines BL and BL_. In this case, the added write-assist latches WAL are also preferably controlled by Y-decode signals and write-enable signals, and write-assist latches WAL in a same column may be controlled by a same assist-enable unit AEU.

FIG. 3 illustrates an exemplary implementation of the write-assist latches WAL, which includes PMOS devices P1, P2, P3, and P4, and NMOS devices N1, N2, N3, and N4. It is noted the circuit shown in FIG. 3 is only one of the various possible implementations. Node Y_CTRL is connected to the output of an assist-enable unit AEU (refer to FIG. 2). Nodes BIT and BIT_BAR are connected to the differential bit-lines BL and BL_, respectively. Preferably, voltage VDD has the same amplitude as the amplitude of the voltages set by the write drivers WD (refer to FIG. 2), although voltage VDD can also have an amplitude greater than the amplitude of the voltages set by the write drivers WD. Accordingly, the write-assist latch WAL is used to amplify the voltages. For example, if voltage VDD is 1V, and voltages at nodes BIT and BIT_BAR are 0.9V and 0V, respectively, transistors N2, N4, P1, and P3 are turned on, while transistors N1, N3, P2, and P4 are turned off. The voltages on nodes BIT and BIT_BAR are thus modified to 1V and 0V, respectively. It is realized that to form 1V and 0V voltages on nodes BIT and BIT_BAR, respectively, the voltage on node BIT must be higher than the threshold voltage of the NMOS devices N1 through N4, and the voltage on node BIT_ BAR must be lower than the threshold voltage of the NMOS devices N1 through N4, before the write-assist latch WAL is turned on. Otherwise, the voltages are wrongfully amplified. This is why the assist-enable unit AEU may need to delay before turning on the write-assist latches WAL.

Figure 4:
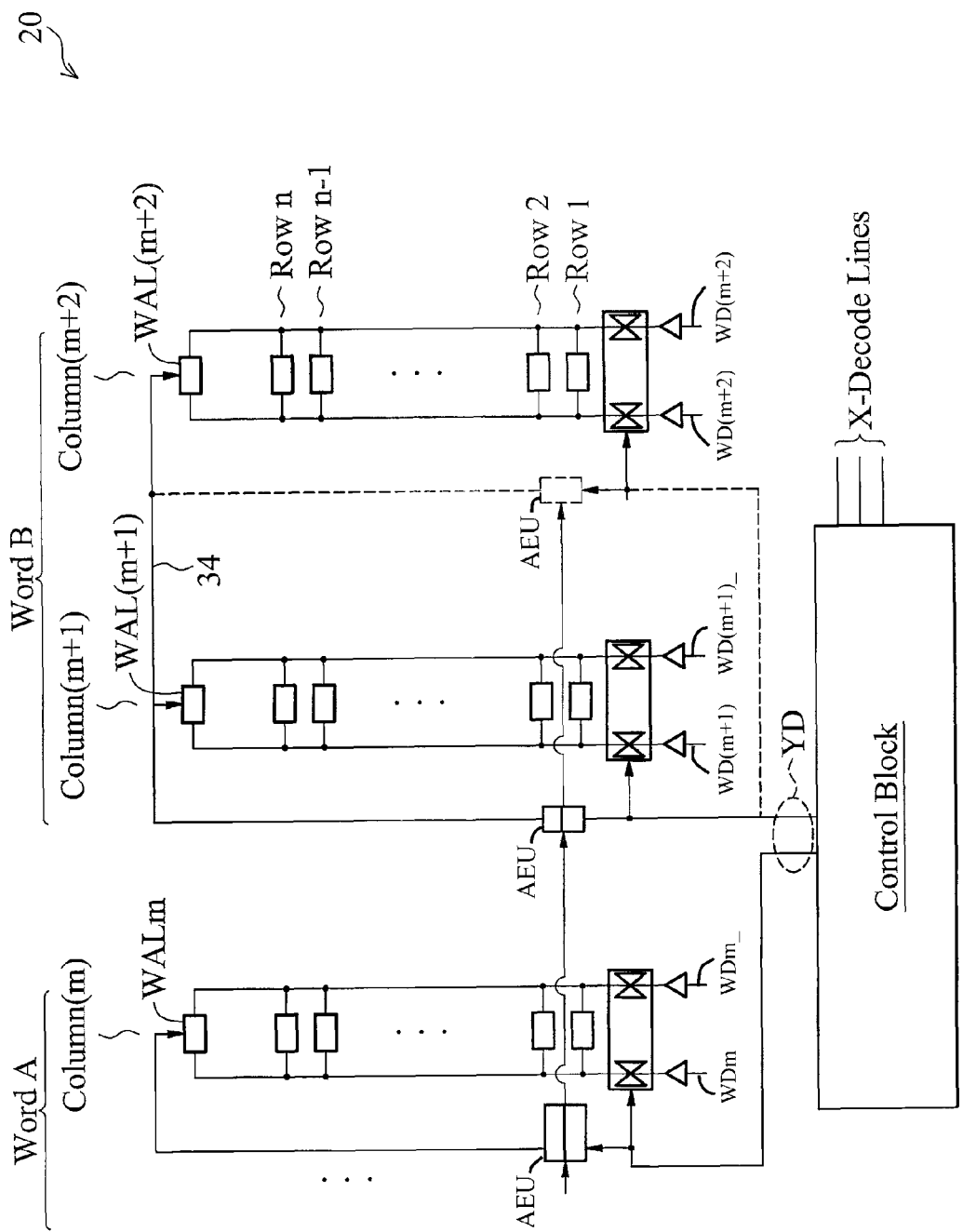
FIG. 4 illustrates an alternative embodiment of the present invention, wherein write-assist latches connected to memory cells of a same word are turned on and off simultaneously.

In the above-discussed embodiments, bit-write schemes are discussed, in which each SRAM cell (bit) may be individually written into regardless of the status of other SRAM cells in the same word. In other embodiments, word-write schemes may be used, in which write operations are performed on a word of memory cells simultaneously. FIG. 4 illustrates SRAM cells in column m in word A, while the SRAM cells in columns (m+1) and (m+2) are in word B. Preferably, write-assist latch WAL(m) is turned on or off independent from write-assist latches WAL(m+1) and WAL(m+2). Write-assist latches WAL(m+1) and WAL(m+2) are turned on or off simultaneously, which may be achieved using a same assist-enable unit AEU (note the solid line 34), or different assist-enable units AEUs sharing common input (Y-decode and write-enable) signals (as shown using dashed lines).

Figure 5:
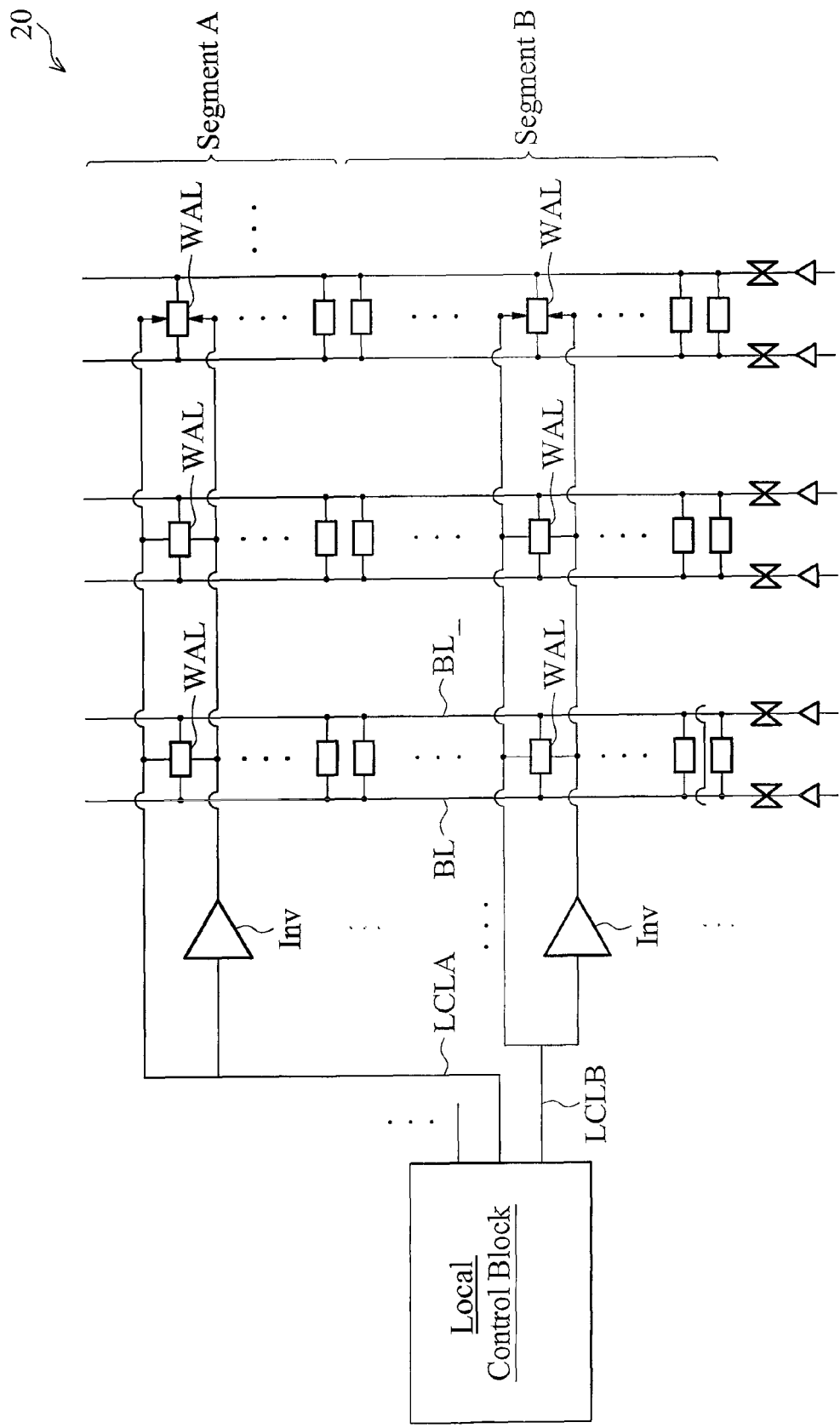
FIG. 5 illustrates an alternative embodiment of the present invention, wherein each segment of the memory array is connected to a row of write-assist latches.

FIG. 5 illustrates an alternative embodiment of the present invention, wherein the write-assist latches WAL in a same row are enabled (or disabled) simultaneously. The write-assist latches WAL in a same row are connected to, and controlled by a same local control line LCL (such as LCLA, LCLB, or the like). Preferably, the local control signals carried by local control lines LCL are output by the local control block, and are used for controlling segments in memory array 20. Please note the segments of memory array 20 are divided according to the assignment of the address pins, hence the segments and the boundaries of the segments in memory array 20 are determined by the design of a global control block (not shown).

Preferably, each segment of the SRAM array has one row of the write-assist latches WAL. For example, the row of write-assist latches WAL connected to local control line LCLA is in segment A, while the row of write-assist latches WAL connected to local control line LCLB is in segment B. The number of the write-assist latches WAL in one column will thus equal the number of the segments. In each segment, the respective write-assist latches WAL are preferably connected to the middle (or substantially the middle) of the segment. When a SRAM cell is being written into, the entire row of write-assist latches WAL in the same segment as the SRAM cell are all turned on.

In alternative embodiments, depending on the design requirement, one segment may include two or more rows of write-assist latches WAL. In yet alternative embodiments, two or more segments (referred to as sharing segments hereinafter) may share one row of write-assist latches WAL. In this case, the row of write-assist latches WAL need to be turned on if any of the sharing segments include a SRAM cell to be written into.

Figure 6:
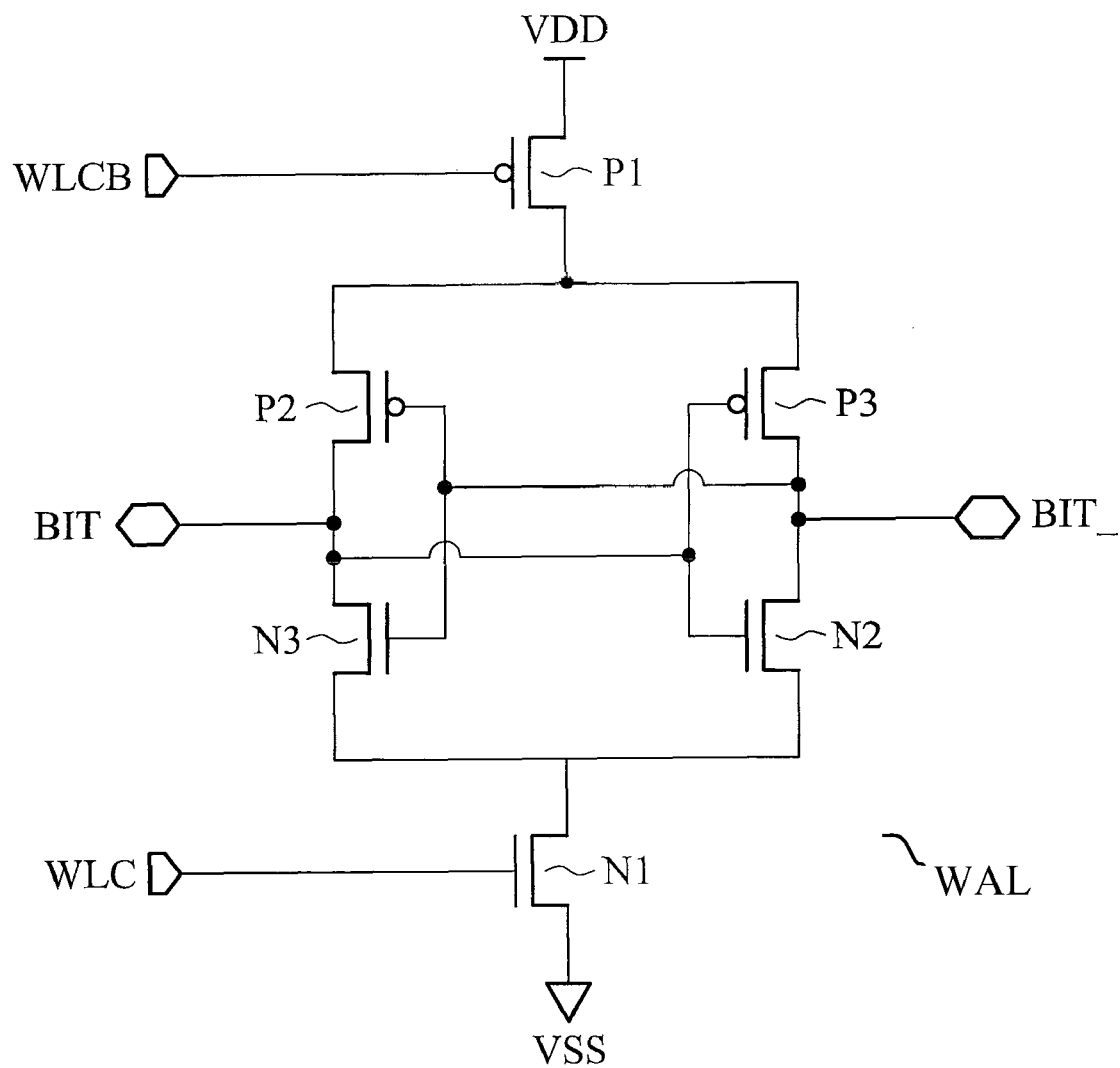

FIG. 6 illustrates an exemplary implementation of the write-assist latches WAL shown in FIG. 5, which includes PMOS devices P1, P2, and P3, and NMOS devices N1, N2, and N3. It is noted the circuit shown in FIG. 6 is only one of the various possible implementations. Again, the illustrated write-assist latch WAL includes nodes BIT and BIT_, which are connected to the differential bit-lines BL and BL_, respectively (refer to FIG. 5). The signals coming from local control signal lines LCL (with the possible connection of inverters Inv, refer to FIG. 5) are connected to nodes WLC and WLCB, respectively, and hence controlling the state (on or off) of the write-assist latches WAL.

The embodiments of the present invention provide write-assist latches to increase bit-line voltages, and hence the writing performance and the reliability are improved. By controlling the operation of the write-assist latches using Y-decode signals, the power consumption is reduced, and the write speed is improved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A memory circuit comprising:
   a memory array comprising:
      a plurality of memory cells arranged in rows and columns;
      a plurality of first bit-lines, each connected to a column of the memory array; and
      a plurality of write-assist latches, each connected to one of the plurality of first bit-lines, wherein each of the plurality of write-assist latches is configured to increase a voltage on a connecting one of the plurality of first bit-lines.

2. The memory circuit of claim 1 further comprising:
   a plurality of multiplexers, each connected to a starting end of one of the plurality of first bit-lines; and
   a plurality of write drivers, each connected to one of the plurality of multiplexers, wherein each of the plurality of write-assist latches is connected to a terminating end of one of the plurality of first bit-lines.

3. The memory circuit of claim 2 further comprising:
   a control block comprising a plurality of Y-decode lines; and
   a plurality of assist-enable units, each comprising a first input connected to one of the plurality of Y-decode lines, and an output connected to one of the plurality of write-assist latches, wherein a multiplexer and an assist-enable unit of a same column are controlled by a same Y-decode line.

4. The memory circuit of claim 3, wherein each of the plurality of assist-enable units is configured to delay a period of time to sync with a voltage on a connecting one of the plurality of first bit-lines.

5. The memory circuit of claim 3, wherein the memory array further comprises a write enable line, and wherein each of the plurality of assist-enable units further comprises a second input connected to the write enable line.

6. The memory circuit of claim 1, wherein the memory array comprises:
   a plurality of segments, wherein the plurality of write-assist latches is in a same row in one of the plurality of segments; and
   a control block comprising a plurality of local control signal lines, wherein the plurality of write-assist latches is connected to a same one of the plurality of local control signal lines.

7. The memory circuit of claim 6 further comprising a plurality of rows of write-assist latches, each row being connected to a same one of the plurality of local control signal lines, wherein each of the plurality of segments comprises one row of the plurality of rows of write-assist latches.

8. The memory circuit of claim 1 further comprising a plurality of second bit-lines, each forming a differential pair with, and in a same column as, one of the plurality of first bit-lines.

9. A memory circuit comprising:
   a control block comprising a plurality of Y-decode outputs;
   a write enable line;
   a memory array comprising a plurality of memory cells arranged in rows and columns, wherein the columns comprise a first column and a second column;
   a first bit-line connected to the first column;
   a multiplexer connected to a starting end of the first bit-line, wherein the multiplexer is further connected to a first Y-decode output in the plurality of Y-decode outputs through a first Y-decode signal line;
   a write driver connected to the multiplexer;
   a first write-assist latch connected substantially close to a terminating end of the first bit-line; and
   a first assist-enable unit comprising a first input connected to the first Y-decode signal line, a second input connected to the write enable line, and an output connected to the first write-assist latch, wherein the first write-assist latch is configured to be enabled and disabled by the output of the first assist-enable unit.

10. The memory circuit of claim 9 further comprising a second bit-line forming a differential pair with the first bit-line, wherein the second bit-line is connected to the first write-assist latch.

11. The memory circuit of claim 9, wherein the first assist-enable unit is configured to provide an assist-enable signal for turning on the first write-assist latch, and to sync the assist-enable signal with a voltage on the first bit-line.

12. The memory circuit of claim 9, wherein the first assist-enable unit is configured to provide an assist-enable signal for turning on the first write-assist latch when both the first Y-decode signal line and the write enable line are at on states.

13. The memory circuit of claim 9, wherein the first write-assist latch is configured to increase a voltage on the terminating end of the first bit-line to substantially equal to a voltage on the starting end of the first bit-line.

14. The memory circuit of claim 9 further comprising:
   a second bit-line connected to the second column;
   a second write-assist latch connected substantially close to a terminating end of the second bit-line; and
   a second assist-enable unit comprising a first input connected to a second Y-decode signal line, a second input connected to the write enable line, and an output connected to the second write-assist latch, wherein the second Y-decode signal line is connected to a second Y-decode output in the plurality of Y-decode outputs.

15. The memory circuit of claim 14, wherein the first and the second assist-enable units are configured to turned on the first and the second write-assist latches independently.

16. The memory circuit of claim 14, wherein the first and the second columns comprise memory cells in a same word, and wherein the first and the second assist-enable units are configured to turned on the first and the second write-assist latches simultaneously.

17. The memory circuit of claim 14, wherein the first assist-enable unit is disconnected from the second Y-decode signal line, and wherein the second assist-enable unit is disconnected from the first Y-decode signal line.

18. A memory circuit comprising:
   a control block comprising a plurality of local control signal lines;
   a memory array comprising a plurality of memory cells arranged in rows and columns; and a row of write-assist latches, each connected to one column of the memory cells, wherein the row of write-assist latches is connected to one of the plurality of local control signal lines.

19. The memory circuit of claim 18, wherein the rows of the memory array are configured as a plurality of segments, and wherein the row of write-assist latches is in substantially a middle position of the one of the segments.

20. The memory circuit of claim 19 further comprising additional rows of write-assist latches, wherein each of the additional rows is in one of the plurality of segments.

21. A method of operating a memory circuit, the method comprising:
providing a control block comprising a plurality of Y-decode signal lines;
providing a memory array comprising:
a column;
a bit-line connected to the column;
a multiplexer connected to a starting end of the bit-line; and
a first write-assist latch connected to the bit-line; and
during a writing time of a memory cell in the column, turning on the first write-assist latch to increase a voltage on the bit-line.

22. The method of claim 21, wherein the step of turning on the first write-assist latch comprises:
generating a Y-decode signal using the control block;
combining the Y-decode signal and a write enable signal to generate an assist-enable signal; and
applying the assist-enable signal to turn on the first write-assist latch.

23. The method of claim 22 further comprising delaying applying the assist-enable signal until a voltage on the bit-line reaches a threshold value.

24. The method of claim 21, wherein each column of the memory array is connected with one write-assist latch, wherein at the time the write-assist latch is turned on, an additional write-assist latch in a neighboring column is turned off, and wherein the neighboring column comprises no memory cells to be written into.

25. The method of claim 24, wherein at the time the write-assist latch is turned on, all write-assist latches in the memory array and connected to columns comprising no memory cells to be written into are turned off.

26. The method of claim 21, wherein the step of turning on the first write-assist latch comprises:
generating a local control signal using the control block;
using the local control signal to generate an assist-enable signal; and
applying the assist-enable signal to turn on the first write-assist latch.

27. The method of claim 26, wherein the local control signal turns on a row of write-assist latches simultaneously, each in a column of the memory array.

28. The method of claim 26, wherein the memory array comprises a plurality of segments, each connected to a local control signal line of the control block, and wherein the method further comprises:
for writing a memory cell in a segment of the memory array, turning on only write-assist latches in the segment, and turning off all write-assist latches in segments comprising no memory cells to be written into.

29. A method of operating a memory circuit, the method comprising:
providing a control block comprising a plurality of Y-decode signal lines;
providing a memory array comprising:
a first column;
a first differential pair of bit-lines connected to the first column;
a multiplexer connected to a starting end of the first differential pair of bit-lines; and
a first write-assist latch connected substantially close to a terminating end of the first differential pair of bit-lines; and
during a writing time for a memory cell in the first column, turning on the first write-assist latch to increase a voltage on one of the differential pair of bit-lines.

30. The method of claim 29, wherein the step of turning on the first write-assist latch comprises:
generating a first assist-enable signal using a Y-decode signal and a write enable signal, wherein the first assist-enable signal is used for controlling the first column; and
using the first assist-enable signal to turn on the first write-assist latch.

31. The method of claim 30 further comprising delaying the first assist-enable signal until voltages on the first differential pair of bit-lines reaches threshold values before the assist-enable signal is provided to the first write-assist latch.

32. The method of claim 29, wherein the memory array further comprises:
a second column comprising no memory cells for being written into during the writing time;
a second differential pair of bit-lines connected to the second column; and
a second write-assist latch connected substantially close to a terminating end of the second differential pair of bit-lines, wherein the method further comprises, during the writing time, turning off the second write-assist latch.

33. The method of claim 32, wherein the step of turning off the second write-assist latch comprises:
generating a second assist-disable signal using an additional Y-decode signal and a write enable signal, wherein the second assist-disable signal is used for controlling the second column; and
using the second assist-disable signal to turn off the second write-assist latch.

34. A method of operating a memory circuit, the method comprising:
providing a control block comprising a plurality of local control signal lines;
providing a memory array comprising:
a first segment;
a first row of write-assist latches in the first segment;
a plurality of differential pairs of bit-lines, each pair being in a column of the array, wherein each pair is connected to one write-assist latch in the first row;
a second segment; and
a second row of write-assist latches in the second segment and connected to the plurality of differential pairs of bit-lines, wherein each pair of the plurality of differential pairs of bit-lines is connected to one write-assist latch in the second row; and
during a writing time for a memory cell in the first segment, turning on the first row of write-assist latches.

35. The method of claim 34, wherein the memory circuit further comprises a control block configured to provide X-decode and Y-decode signals and local control signals, wherein the step of turning on the first row of write-assist latches comprises inputting one of the local control signals corresponding to the first segment of the first row of write-assist latches.

36. The method of claim 34, wherein during the writing time, the second segment comprises no memory cells to be written into, and wherein the method further comprises turning off the second row of write-assist latches during the writing time.

37. The method of claim 36, wherein the memory circuit further comprises a control block configured to provide X-decode and Y-decode signals and local control signals, wherein the step of turning off the second row of write-assist latches comprises inputting one of the local control signals corresponding to the second segment of the second row of write-assist latches.

* * * * *